(12) United States Patent
Yasuda et al.

(10) Patent No.: US 7,781,777 B2
(45) Date of Patent: Aug. 24, 2010

(54) PN JUNCTION TYPE GROUP III NITRIDE SEMICONDUCTOR LIGHT-EMITTING DEVICE

(75) Inventors: Takaki Yasuda, Chiba (JP); Hideki Tomozawa, Chiba (JP)

(73) Assignee: Showa Denko K.K., Tokyo (JP)

( * ) Notice: Subject to any disclaimer, the term of this patent is extended or adjusted under 35 U.S.C. 154(b) by 49 days.

(21) Appl. No.: 10/591,987

(22) PCT Filed: Mar. 8, 2005

(86) PCT No.: PCT/JP2005/004390

§ 371 (c)(1),
(2), (4) Date: Jan. 24, 2007

(87) PCT Pub. No.: WO2005/086243

PCT Pub. Date: Sep. 15, 2005

(65) Prior Publication Data

US 2008/0230794 A1    Sep. 25, 2008

Related U.S. Application Data

(60) Provisional application No. 60/553,533, filed on Mar. 17, 2004.

(30) Foreign Application Priority Data

Mar. 8, 2004    (JP) ............................. 2004-063946

(51) Int. Cl.
*H01L 27/15*    (2006.01)

(52) U.S. Cl. .............................. 257/79; 257/14; 257/11; 257/18; 257/25; 257/13; 257/87; 257/88; 257/98; 257/99; 438/26; 438/46; 438/503; 438/507

(58) Field of Classification Search .................... 259/79
See application file for complete search history.

(56) References Cited

U.S. PATENT DOCUMENTS 5,245,622 A * 9/1993 Jewell et al. .............. 372/45.01
5,251,225 A * 10/1993 Eglash et al. ............ 372/45.01
5,541,949 A * 7/1996 Bhat et al. .............. 372/45.011

(Continued)

FOREIGN PATENT DOCUMENTS

JP    55-3834    1/1980

(Continued)

*Primary Examiner*—Fernando L Toledo
*Assistant Examiner*—Ankush k Singal
(74) *Attorney, Agent, or Firm*—Sughrue Mion, PLLC

(57) ABSTRACT

A pn junction type Group III nitride semiconductor light-emitting device 10 (11) of the present invention has a light-emitting layer 2 of multiple quantum well structure in which well layers 22 and barrier layers 21 including Group III nitride semiconductors are alternately stacked periodically between an n-type clad layer 105 and a p-type clad layer 107 which are formed on a crystal substrate and which include Group III nitride semiconductors, in which one end layer 21*m* of the light-emitting layer 2 is closest to and opposed to the n-type clad layer, and the other end layer 21*n* of the light-emitting layer 2 is closest to and opposed to the p-type clad layer, both the one and the other end layers are barrier layers, and the other end layer 21*n* is thicker than the barrier layer of the one end layer.

4 Claims, 2 Drawing Sheets

U.S. PATENT DOCUMENTS

| | | | | |
|---|---|---|---|---|
| 5,617,436 A * | 4/1997 | Lo | | 372/45.011 |
| 5,719,891 A * | 2/1998 | Jewell | | 372/46.013 |
| 5,883,912 A * | 3/1999 | Ramdani et al. | | 372/45.01 |
| 5,900,642 A * | 5/1999 | Nakatsu et al. | | 257/25 |
| 5,959,401 A * | 9/1999 | Asami et al. | | 313/503 |
| 5,963,576 A * | 10/1999 | Claisse et al. | | 372/96 |
| 5,991,326 A * | 11/1999 | Yuen et al. | | 372/96 |
| 6,130,780 A * | 10/2000 | Joannopoulos et al. | | 359/584 |
| 6,434,178 B1 * | 8/2002 | Ubukata | | 372/45.011 |
| 6,486,491 B1 * | 11/2002 | Najda | | 257/18 |
| 6,489,175 B1 * | 12/2002 | Jiang et al. | | 438/29 |
| 6,683,898 B2 * | 1/2004 | Østergaard et al. | | 372/43.01 |
| 6,709,881 B2 * | 3/2004 | Hasegawa et al. | | 438/24 |
| 6,711,195 B2 * | 3/2004 | Chang et al. | | 372/45.01 |
| 6,800,878 B2 * | 10/2004 | Nambu et al. | | 257/194 |
| 6,801,558 B2 * | 10/2004 | Burak | | 372/50.11 |
| 6,821,800 B2 * | 11/2004 | Koide et al. | | 438/22 |
| 6,838,706 B2 * | 1/2005 | Watanabe et al. | | 257/103 |
| 6,931,044 B2 * | 8/2005 | Bour et al. | | 372/46.01 |
| 6,975,660 B2 * | 12/2005 | Johnson | | 372/45.01 |
| 6,993,055 B2 * | 1/2006 | Wang et al. | | 372/46.013 |
| 7,190,001 B2 * | 3/2007 | Taki | | 257/79 |
| 7,254,155 B1 * | 8/2007 | Deng et al. | | 372/97 |
| 7,263,114 B2 * | 8/2007 | Cho | | 372/45.01 |
| 7,282,732 B2 * | 10/2007 | Gray et al. | | 257/14 |
| 7,358,522 B2 * | 4/2008 | Yanamoto | | 257/14 |
| 7,378,680 B2 * | 5/2008 | Johnson et al. | | 257/11 |
| 2001/0050934 A1 * | 12/2001 | Choquette et al. | | 372/43 |
| 2002/0034203 A1 * | 3/2002 | Shimizu et al. | | 372/45 |
| 2002/0053676 A1 * | 5/2002 | Kozaki | | 257/88 |
| 2002/0071471 A1 * | 6/2002 | Kim et al. | | 372/96 |
| 2002/0196827 A1 * | 12/2002 | Shields et al. | | 372/45 |
| 2003/0006409 A1 * | 1/2003 | Ohba | | 257/18 |
| 2003/0091085 A1 * | 5/2003 | Northrup et al. | | 372/50 |
| 2003/0116767 A1 * | 6/2003 | Kneissl et al. | | 257/79 |
| 2003/0151044 A1 * | 8/2003 | Yamada | | 257/14 |
| 2003/0178629 A1 * | 9/2003 | Yagi | | 257/87 |
| 2003/0183827 A1 * | 10/2003 | Kawaguchi et al. | | 257/79 |
| 2003/0205736 A1 * | 11/2003 | Kozaki | | 257/200 |
| 2003/0235229 A1 * | 12/2003 | Deng et al. | | 372/96 |
| 2004/0026705 A1 * | 2/2004 | Kato et al. | | 257/94 |
| 2004/0129931 A1 * | 7/2004 | Asryan et al. | | 257/14 |
| 2004/0155250 A1 * | 8/2004 | Ohba | | 257/79 |
| 2004/0219699 A1 * | 11/2004 | Koyama et al. | | 438/22 |

FOREIGN PATENT DOCUMENTS

| | | |
|---|---|---|
| JP | 7-86637 A | 3/1995 |
| JP | 2000-133883 | 5/2000 |
| JP | 2000-332364 A | 11/2000 |
| JP | 2001-102629 A | 4/2001 |
| JP | 2002-223042 A | 8/2002 |
| JP | 2003-031902 A | 1/2003 |
| JP | 2003-229645 | 8/2003 |

* cited by examiner

PN JUNCTION TYPE GROUP III NITRIDE SEMICONDUCTOR LIGHT-EMITTING DEVICE

CROSS REFERENCE TO RELATED APPLICATIONS

This application is an application filed under 35 U.S.C. §111(a) claiming the benefit pursuant to 35 U.S.C. §119(e)(1) of the filing date of Provisional Application No. 60/553,533 filed Mar. 17, 2004 pursuant to 35 U.S.C §111(b).

TECHNICAL FIELD

The present invention relates to a pn junction type Group III nitride semiconductor light-emitting device having a light-emitting layer of multiple quantum well structure in which well layers and barrier layers including Group III nitride semiconductors are alternately stacked periodically between an n-type clad layer and a p-type clad layer which are formed on a crystal substrate and which include Group III nitride semiconductors.

BACKGROUND ART

Conventionally, the Group III nitride semiconductor is utilized as function material for constituting a Group III nitride semiconductor light-emitting device of pn hetero junction structure, such as a light-emitting diode (LED), which radiates visible light of short wavelength (see JP-A 2000-332364). For example, when an LED which emits light in a near-ultraviolet region, blue region or green region is to be formed, n-type or p-type aluminum nitride gallium ($Al_X$-$Ga_YN$: $0 \leq X$, $Y \leq 1$, $X+Y=1$) is utilized for forming a clad layer (see JP-A 2003-229645). The gallium nitride indium ($Ga_YIn_ZN$: $0 \leq Y$, $Z \leq 1$, $Y+Z=1$) is utilized for forming an active layer (light emitting layer) (see JP-B SHO 55-3834).

Conventionally, there is disclosed a technique for forming a light-emitting layer from single $Ga_YIn_ZN$ ($0 \leq Y$, $Z \leq 1$, $Y+Z=1$) (see JP-B SHO 55-3834). An example for forming a light-emitting layer from a super lattice structure called quantum well structure is also known (see JP-A 2001-102629). The quantum well structure is a structure in which barrier layers and well layers are alternately stacked periodically (see JP-A 2000-133883). For example, there is disclosed an embodiment in which a $Ga_{0.7}In_{0.3}N$ layer is used as the well layer, and gallium nitride (GaN) is used as the barrier layer, and a light-emitting layer of a multiple quantum well structure is formed (see in JP-A 2001-102629).

However, in the above conventional techniques, the one end and the other end of the light-emitting layer are not limited to the barrier layers, and when one of the ends is a well layer, a carrier (electron) is prone to be dispersed toward the clad layer through the well layer, and there is a problem that the light emitting output is reduced by the same amount.

Even if the other end of the light-emitting layer that is in contact with the p-type clad layer is formed with the barrier layer, the thickness of the barrier layer is not enough, carrier charged from the n-type clad layer is not prevented from flowing toward the p-type clad layer, and there is a problem that the light emitting output is reduced by this influence.

DISCLOSURE OF THE INVENTION

The present invention has been accomplished in view of the above circumstances, and it is an object of the invention to provide a pn junction type Group III nitride semiconductor light-emitting device capable of suppressing the dispersion of a carrier toward a clad layer and largely enhancing the light emitting output even if a light-emitting layer is of a multiple quantum well structure.

To achieve the above object, the present invention provides a pn junction type Group III nitride semiconductor light-emitting device having a light-emitting layer of multiple quantum well structure in which well layers and barrier layers including Group III nitride semiconductors are alternately stacked periodically between an n-type clad layer and a p-type clad layer which are formed on a crystal substrate and which include Group III nitride semiconductors, in which one end layer of the light-emitting layer is closest to and opposed to the n-type clad layer, and the other end layer of the light-emitting layer is closest to and opposed to the p-type clad layer, both the one and the other end layers are barrier layers, and the other end layer is thicker than the barrier layer of the one end layer.

In the pn junction type Group III nitride semiconductor light-emitting device, each of the barrier layers has a thickness increased gradually from the one end layer toward the other end layer.

In the first or second mentioned pn junction type Group III nitride semiconductor, the other end layer has an impurity concentration low at its junction portion relative to the well layer, highest at its central portion and reduced gradually from the central portion toward the p-type clad layer.

In any one of the first to third mentioned pn junction type Group III nitride semiconductor, the other end layer has joined thereto a well layer which is not intentionally doped with impurities.

According to the present invention, in the light-emitting layer of the multiple quantum well structure, layers forming both ends of the light-emitting layer are barrier layers. Thus, it is possible to suppress the dispersion of carrier toward the clad layer, and since carrier is enclosed with the well layer, the light emitting output can be enhanced.

The other end layer of the barrier layers forming the both ends of the light-emitting layer of the multiple quantum well structure that is in contact with the p-type clad layer is thicker than the one end layer. Thus, carrier charged from the n-type clad layer is prevented from flowing toward the p-type clad layer, and the light emitting output can be enhanced.

According to the present invention, the light emitting efficiency can be enhanced by about 1.5 times. Therefore, the light emitting output of an LED lamp and lightning conversion efficiency can be enhanced by about 1.5 times, and energy can be saved.

According to the present invention, the thickness of each of the barrier layers is gradually increased from the one end layer toward the other end layer. Thus, the carrier can be enclosed with the well layer more strongly. In this case, the thickness of each of the barrier layers is preferably set to such a value that the light emitting wavelength from the well layer is not varied.

Further, the impurity concentration of the other end layer is low at its junction portion relative to the well layer, is the highest at its central portion and is gradually reduced from the central portion toward the p-type clad layer. Thus, the environment that affects the well layer which is in contact with the other layer, and the charging efficiency of a hole formed toward the multiple quantum well layer are both satisfied.

Further, a well layer which is not intentionally doped with impurities is joined to the other end layer. Thus, crystallinity of the well layer and light emitting efficiency can be enhanced.

BEST MODE FOR CARRYING OUT THE INVENTION

Figure 1:
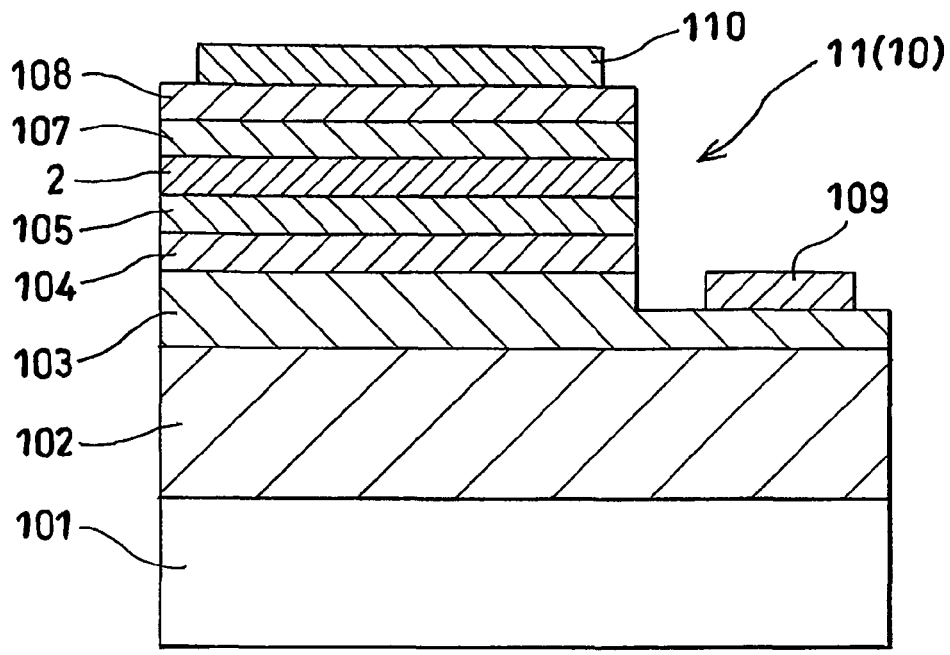
FIG. 1 is a schematic cross section showing a stacked structure used for producing an LED of a first embodiment.

An embodiment of the present invention will be described in detail below.

According to the invention, a pn junction type Group III nitride semiconductor light-emitting device is formed using an n-type or p-type Group III nitride semiconductor layer formed on a crystal substrate, especially a single crystal substrate.

That is, the pn junction type Group III nitride semiconductor light-emitting device of the present invention has a light-emitting layer of multiple quantum well structure in which well layers and barrier layers including Group III nitride semiconductors are alternately stacked periodically between an n-type clad layer and a p-type clad layer which are formed on a crystal substrate and which include Group III nitride semiconductors, one end layer of the light-emitting layer is closest to and opposed to the n-type clad layer, and the other end layer of the light-emitting layer is closest to and opposed to the p-type clad layer, both the one and the other end layers are barrier layers, and the other end layer is thicker than the barrier layer of the one end layer.

The clad layer closer to the crystal substrate may be of n-type or p-type.

When the Group III nitride semiconductor layer is formed, single crystal is used as material of the substrate. As the material, it is possible to use oxide single crystal material, such as sapphire ($\alpha$-$Al_2O_3$ single crystal), zinc oxide (ZnO) and lithium gallium oxide ($LiGaO_2$) which have relatively high melting point and heat resistance property; Group IV semiconductor single crystal, such as silicon (Si) single crystal, cubical crystal and silicon carbide of hexagonal crystal; and Group III-V compound semiconductor single crystal material, such as gallium phosphide (GaP). Optically transparent single crystal material through which light from the light-emitting layer can pass can effectively be used for substrates.

The n-type and p-type Group III nitride semiconductor layers (clad layer) provided on the single crystal substrate have composition formula of $Al_XGa_YIn_ZN_{1-a}M_a$ ($0 \leq X \leq 1$, $0 \leq Y \leq 1$, $0 \leq Z \leq 1$, $X+Y+Z=1$, symbol M represents a Group V element that is different from nitrogen, and $0 \leq a < 1$). When there exists lattice mismatch between the single crystal substrate and the Group III nitride semiconductor layer (clad layer) to be formed on the substrate, it is preferable that a low or high temperature buffer layer which moderates the mismatch and which becomes an upper layer having excellent crystallinity is interposed between the layers. The buffer layer may be made of aluminum nitride, gallium ($Al_XGa_YN$: $0 \leq X \leq 1$, $0 \leq Y \leq 1$, $X+Y=1$) for example.

It is not always necessary that the n-type and p-type clad layers are made of Group III nitride semiconductor materials having the same composition ratio. For example, the n-type clad layer may be made of gallium nitride (GaN), and the p-type clad layer may be made of aluminum gallium nitride ($Al_XGa_YN$). It is preferable that the n-type and p-type clad layers are made of a Group III nitride semiconductor in which band gap is larger than the barrier layer which constitutes a quantum well structure forming the light-emitting layer.

The light-emitting layer disposed between the n-type clad layer and the p-type clad layer is of a multiple quantum well structure in which well layers and barrier layers made of a Group III nitride semiconductor are alternately stacked periodically, and both end layers (one end layer and the other end layer) are barrier layers. This is because dispersion of carriers toward the n-type and p-type clad layers is prevented more effectively. Among the layers constituting the light-emitting layer of the present invention, the one end layer which is closest to and opposed to the n-type clad layer, and the other end layer which is closest to and opposed to the p-type clad layer are barrier layers.

The well layer is made of a Group III nitride semiconductor having smaller band gap than the barrier layer. For example, the well layer is made of gallium indium nitride ($Ga_YIn_ZN$: $0 \leq Y \leq 1$, $0 \leq Z \leq 1$, $Y+Z=1$). The indium composition ratio (gallium composition ratio) of $Ga_YIn_ZN$ is appropriately selected such that light of desired wavelength can be obtained. A light-emitting layer of the light-emitting device which emits light having short wavelength in a near-ultraviolet region, blue region or green region can be made of $Ga_YIn_ZN$ ($0.25 \leq Z \leq 0.40$ and $Y+Z=1$) having an indium composition ratio of about 0.40 (=40%) or less, preferably 0.25.

The well layer constituting a light-emitting layer of the multiple quantum well structure can be made of a Group III nitride semiconductor including nitrogen and Group V element other than nitrogen, such as gallium nitride phosphide ($GaN_{1-a}P_a$: $0 \leq a < 1$). In the $GaN_{1-a}P_a$, the band gap is abruptly varied depending upon a phosphorus (P) composition ratio (=a) (in other words, depending upon a nitride (N) composition ratio (=1−a). A well layer capable of radiating light from ultraviolet band to red band can be made of $GaN_{1-a}P_a$ utilizing this band bowing.

To obtain a light-emitting device having low forward voltage (Vf) or threshold voltage (Vth) and high light emitting strength, it is preferable that the number of well layers forming the multiple quantum well structure is three or more and six or less. A well layer which is to be joined to a barrier layer forming the other end layer of the quantum well structure is made of an undoped Group III nitride semiconductor layer in order to stabilize the wavelength of light emission from the light-emitting layer of the multiple quantum well structure. Other well layer, such as a well layer which is to be joined to the one end layer, may be made of a Group III nitride semiconductor layer doped with impurities. A well layer other than the layer which is joined to the other end layer does not affect the wavelength of light emission. If a well layer other than the layer which is joined to the other end layer is made of a Group III nitride semiconductor layer doped with impurities, the effect of reducing Vf or Vth is enhanced.

The barrier layer of quantum well structure is made of a Group III nitride semiconductor layer having band gap of about ten times or more the thermal kinetic energy (=0.026 eV) of electron at room temperature as compared with band gap of a Group III nitride semiconductor constituting the well layer. Preferably, the barrier layer is made of a Group III nitride semiconductor including a plurality of Group V elements, such as $Al_XGa_YN$ ($0 \leq X \leq 1$, $0 \leq Y \leq 1$, $X+Y=1$) or $GaN_{1-a}P_a$.

In this invention, the barrier layer of the other end layer is made of a Group III nitride semiconductor layer having thickness greater than that of the other barrier layer. This is because electron which flows into the light-emitting layer from the n-type clad layer through the barrier layer of the one end layer is effectively enclosed with the well layer which is joined to the other end layer. Suitable thickness of the barrier layer other than the other end layer of quantum well structure is 15 nm or more and 50 nm or less. The thickness of the barrier layer of the other end layer is 1.2 times or more and 2.5 times or less the thickness of the other barrier layer.

Even if the quantum well structure is formed using a barrier layer whose thickness is gradually increased from the one end layer toward the other end layer, it is effective to suppress the excessive inflow (overflow of electron) of electron charged from the n-type clad layer toward the p-type clad layer. For example, if the thickness of the barrier layer of the one end layer is defined as 1.0 as a reference, the thickness of the barrier layer disposed closer to the other end layer is 1.5, and the thickness of the barrier layer disposed next closer to the other end layer is 2.0, and the thickness of the barrier layer of the other end layer is 2.5. Alternatively, the barrier layers of the one end layer and of a layer close to the one end layer have the same thickness, several barrier layers at central portion of the quantum well structure are further increased, the barrier layer close to the other end layer is further increased, the other end layer has the greatest thickness, the thicknesses of the layers are increased in stage from the one end layer toward the other end layer.

The barrier layer forming the other end layer is made of a Group III nitride semiconductor layer in which impurity concentration is low on its side joined to the well layer and is highest at a central portion of the layer and is gradually reduced from the central portion toward the p-type clad layer. With this structure, light emitting wavelength from the light-emitting layer is stabilized. That is, the other end layer is made of a Group III nitride semiconductor layer whose dopant concentration is reduced from the central portion of the layer toward the p-type clad layer. The other barrier layer constituting the quantum well structure may be made of an undoped layer or a layer doped with impurities. If the other barrier layer, as well as the other end layer, is made of the Group III nitride semiconductor doped with impurities, the Vf or Vth can be reduced. In the case of the barrier layer, distribution manner of concentration of impurities in the layer doped with impurities is not limited. The distribution may be the same as that of the barrier layer of the other end layer or may be uniform in the thickness direction.

The barrier layer and well layer for constituting the quantum well structure of the invention may be formed using metal-organic chemical vapor deposition (MOCVD, MOVPE or OMVPE), molecular beam epitaxy (MBE), halide vapor deposition, hydride vapor growth. Especially the MOCVD is effective because a Group III nitride semiconductor includes an element having high volatile, such as phosphorus (P), arsenic (As) and the like. The constituent layers for constituting the Group III nitride semiconductor light-emitting devices may be formed using different vapor phase growing means. For example, the barrier layer or well layer forming the light-emitting layer may be formed by normal pressure (substantially atmospheric pressure) or reduced pressure MOCVD, and n-type or p-type clad layer may be formed by MBE, but it is easy to form the constituent layers using the same vapor phase growing means.

Examples of impurities suitable for obtaining a barrier layer doped with impurities (e.g., an n-type barrier layer) are Group IV elements, such as silicon (Si), germanium (Ge) and tin (Sn), and Group VI elements, such as selenium (Se) and tellurium (Te). Examples of impurities suitable for obtaining a p-type barrier layer are Group II elements, such as magnesium (Mg) and calcium (Ca). The concentration of impurities doped in the barrier layer can be measured using device analysis means, such as secondary ion mass spectrometry (SIMS) or Auger electron analysis.

The barrier layer of the other end layer is allowed to grow in an undoped state, i.e. without supplying the impurities to the growing reaction system. When the layer thickness of the barrier layer reaches about half of a desired thickness, a large amount of impurities are abruptly added, and a region including high impurity concentration is formed in the central portion of the barrier layer. After the region having a desired thickness and high concentration impurities formed in the central portion is formed, the amount of impurities to be added is reduced with the elapse of time, and the growth is continued until a desired thickness is obtained. If the amount of impurities to be added to the growing reaction system is varied with the elapse of time in this manner, the concentration of impurities in the other end layer is low on the side joined to the well layer, is highest at the central portion of the layer and is gradually reduced from the central portion toward the p-type clad layer.

It is preferable that the thickness of the region of the high concentration of impurities provided in the barrier layer forming the other end layer is 2.5 nm or more and 40 nm or less. A preferable range of the concentration of impurities in this high concentration of impurities is $1 \times 10^{18}$ cm$^{-3}$ or more and $1 \times 10^{19}$ cm$^{-3}$ or less. If the concentration of impurities in this region is increased as the thickness is thinner, this is advantageous for preventing the forward voltage from increasing. For example, when the thickness of the region of the high concentration of impurities is in a range of 2.5 nm to 5.0 nm, if the impurity concentration is set in a range of $5 \times 10^{18}$ cm$^{-3}$ to $1 \times 10^{13}$ cm$^{-3}$ low forward voltage can be obtained.

The inside region of the barrier layer forming the other end layer that is joined to the well layer may not be the undoped region. It is only necessary that the concentration of impurities to be added is low as compared with the central region of the other end layer. The low impurity concentration is less than $1 \times 10^{16}$ cm$^{-3}$ or more and less than $1 \times 10^{18}$ cm$^{-3}$, and more preferably, $5 \times 10^{16}$ cm$^{-3}$ or more and $5 \times 10^{17}$ cm$^{-3}$ or less.

It is preferable that a well layer which is not intentionally doped with impurities is joined to the barrier layer forming the other end layer. If the well layer of high purity having small impurity concentration is joined, secondary light emission caused by a portion formed of impurities can be avoided, and light having excellent monochrome can be obtained. The probability of generation of distortion caused by impurities is reduced, and there is a merit that light having desired wavelength can stably be obtained.

The n-type clad layer joined to the one end layer of the light-emitting layer can be made of n-type $Ga_Y In_Z N$ ($0 \leq X$, $Y \leq 1$, $X+Y=1$) of band gap greater than that of the well layer, or can be made of n-type $Al_X Ga_Y N$ ($0 \leq X, Y \leq 1, X+Y=1$). If the n-type clad layer is made of $Ga_Y In_Z N$, a light-emitting layer whose crystal distortion is moderated can be formed on the clad layer. Further, a Group III nitride semiconductor light-emitting device having excellent light emitting efficiency can be obtained. As the n-type clad layer, it is possible to use $Ga_{Y1} In_{Z1} N/Ga_{Y2} In_{Z2} N$ ($0 \leq Y_1, Y_2, Z_1, Z_2 \leq 1, Y_1 \neq Y_2, Z_1 \neq Z_2, Y_1+Z_1=1, Y_2+Z_2=1$) super lattice structure made of gallium indium nitride layer. If such a super lattice structure is used as a ground layer, a light-emitting layer whose crystal distortion is moderated can be formed, and a Group III nitride semiconductor light-emitting device whose light emitting efficiency is enhanced can be obtained.

The Group III nitride semiconductor light emitting device of the present invention is provided with an ohmic electrode provided on a stacked structure having a light-emitting layer of the multiple quantum well structure including the barrier layer of the structure of the present invention. When the crystal substrate is made of material having excellent conductivity, such as silicon (Si) or cubical crystal 3C crystal type, hexagonal crystal 4H or 6H crystal type silicon carbide (SiC), one of n-type and p-type ohmic electrodes is provided in correspondence with the conductive type of the crystal material which forms the substrate. An ohmic electrode which is suitable for the other conductive type is provided on a clad layer having opposite conductive type from that of the crystal of the substrate or on a contact layer on the clad layer on a multiple quantum well structure having the structure of the present invention.

When the substrate is made of high resistant or electrically insulation sapphire, n-type or p-type ohmic electrode cannot be provided in direct contact with the substrate. Thus, each of them is provided on an n-type or p-type layer having a stacked structure. For example, an n-type (p-type) ohmic electrode is provided on an n-type (p-type) clad layer or contact layer on the same clad layer. Alternatively, it is provided on an n-type (p-type) intermediate layer including $Ga_Y In_Z N$ ($0 \leq Y, Z \leq 1$, $Y+Z=1$) for gently reducing the difference of band gap of the light-emitting layer or enhancing the crystallinity, that is disposed between the n-type (p-type) clad layer and the n-type (p-type) light-emitting layer.

It is not suitable to provide the insulation or high-resistance crystal substrate with an electrically conductive ohmic electrode, but alternatively, in the case of an optically transparent substrate, a reflection film exhibiting a function of reflecting light passing through the substrate in an outside taking-out direction and made of multiple metal film including a single metal film or multiple metal films, is provided on a substrate surface opposed to that formed with the stacked structure. If the transparent high-resistant substrate having reflection function of light emitting is utilized, Group III nitride semiconductor LED having strong light emitting ability can be obtained. A reflection layer which reflects light of blue band or green band can be made of rare metal, nickel (Ni) or alloy thereof.

An n-type or p-type contact layer provided for forming a low contact resistant n-type or p-type ohmic electrode is made of n-type or p-type Group III-V nitride semiconductor material having low resistance. The contact layer provided in a direction in which light from the light-emitting layer is allowed to pass to the outside is made of material having higher band gap through which light can pass exceeding band gap corresponding to light emitting wavelength. For example, it is made of Group III nitride semiconductor material having greater band gap than material of the well layer forming the multiple quantum well structure of the present invention. For example, it can be made of boron phosphide (BP) or mixed crystal of high band gap based on BP, such as boron gallium phosphide ($B_Q Ga_R P$: $0<Q$, $R<1$, $Q+R=1$) or boron indium phosphide ($B_Q In_R P$: $0<Q$, $R<1$, $Q+R=1$). In the case of BP of monomer, n-type and p-type resistant layers can easily be obtained by adjusting the growing temperature even in an undoped state and thus, this is suitable material for forming the contact layer.

If the n-type or p-type ohmic electrode provided in a direction in which light emitted from the light-emitting layer of the multiple quantum well structure of the present invention is taken outside the LED is formed like a mesh electrode having an opening or a lattice electrode in which electrodes are disposed in a matrix manner, a high emission strength LED can be obtained. If the electrode has such a shape that a surface of the clad layer or contact layer provided with the ohmic electrode is partially covered, a rate of absorption of light is reduced by the electrode material, and the amount of light which is not absorbed through the opening and passes is increased. Thus, an LED having high light emitting strength can be obtained.

As described above, according to the embodiment of the present invention, in the light-emitting layer of the multiple quantum well structure, since both layers forming both ends thereof are barrier layers, dispersion of carriers from the light-emitting layer toward the clad layer can be suppressed. That is, since the carriers are enclosed with the well layer, light emitting output can be enhanced.

Of the barrier layers forming both the ends of the light-emitting layer of the multiple quantum well structure, the one end layer which is in contact with the p-type clad layer is thicker than the other barrier layer. Thus, inflow of the carrier (electron) charged from the n-type clad layer toward the p-type clad layer can be suppressed, and the light emitting output can be increased.

If well layers exist on the one end side and the other end side of the light-emitting layer as in the conventional technique, since the well layer comes into direct contact with the clad layer, only the well layer is joined to a different crystallinity and different band gap layer, and there is a problem that the crystallinity, distortion and light emitting wavelength are different as compared with the other well layer. On the other hand, according to the embodiment of the present invention, since both layers forming both ends of the light-emitting layer are barrier layers, a layer which comes into contact with the well layer is always the barrier layer, and therefore the environment surrounding the well layer is the same. Thus, the light emitting effect of the well layer is constant, and the light emitting wavelength is stabilized and variation is small. As described above, if there exists a well layer which comes into contact with the clad layer, this well layer and a layer which is in contact with the well layer sandwiched between barrier layers formed inside of that well layer are different and thus, the light emitting effect is affected, the wavelength becomes long, and the half-width of the light emitting peak is increased.

According to the embodiment of this invention, a layer which comes into contact with the well layer is always the barrier layer, the order of growing is a barrier layer→a well layer→a barrier layer and thus, the growing condition is substantially the same over any well layers, the well layer can be formed more stably, the generation of point defect can be suppressed, and the quality thereof is excellent. Also from this reason, the light emitting output can be improved. If a well layer that comes into contact with the clad layer exists as in the conventional technique, the well layer and a layer which comes into contact with a well layer sandwiched between barrier layers and which is formed inside of the well layer are different, and the growing conditions of the clad layer and the barrier layer are different. Thus, point defects are generated in the well layer which comes into contact with the clad layer, and the light emitting output is deteriorated.

According to the present invention, the light emitting efficiency can be enhanced by about 1.5 times. Thus, both the light emitting output and electro-optical conversion efficiency of the LED lamp can be enhanced by about 1.5 times, and energy can be saved.

EXAMPLE 1

The present invention will be described concretely based on a case in which a Group III nitride semiconductor light emitting diode is produced using a light-emitting layer of multiple quantum well structure of the present invention formed on a sapphire substrate.

Figure 2:
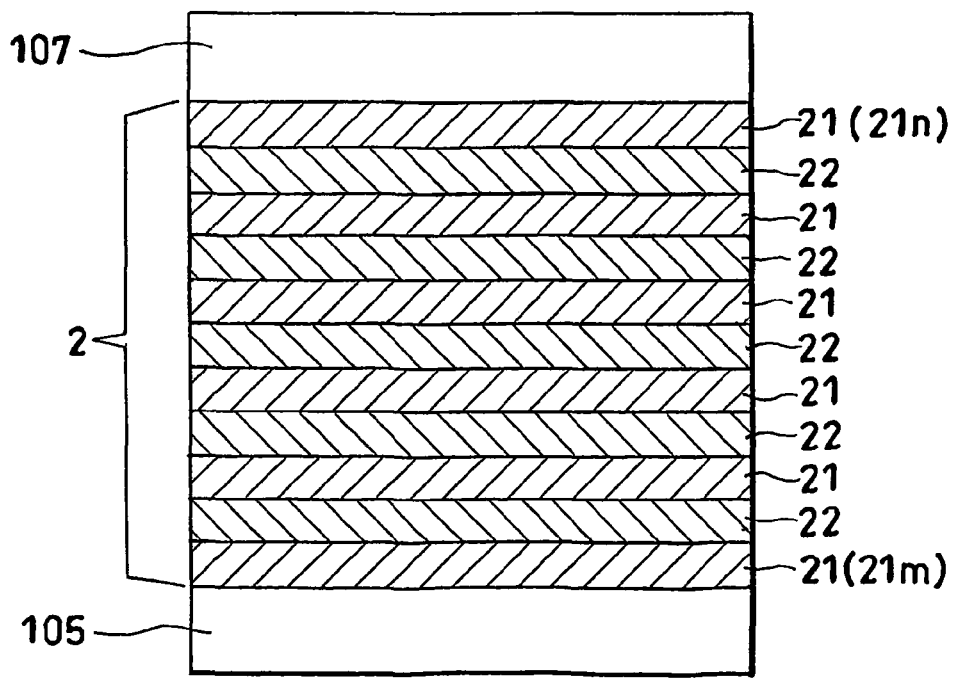
FIG. 2 is a schematic view showing a light-emitting layer of the stacked structure shown in FIG. 1.
Figure 3:
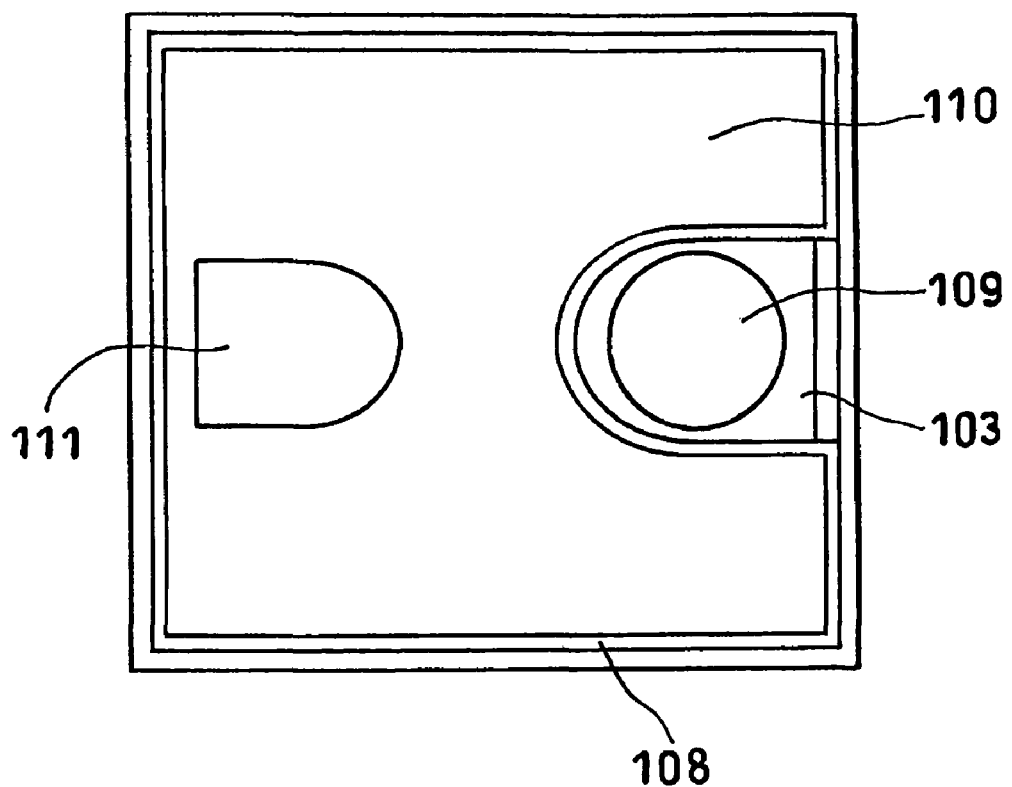
FIG. 3 is a schematic plan view of the LED produced from the stacked structure shown in FIG. 1.

FIG. 1 is a schematic sectional view of a stacked structure used for producing the LED of Example 1. FIG. 2 is a schematic diagram showing a structure of the light-emitting layer of the stacked structure shown in FIG. 1. FIG. 3 is a schematic plan view of the LED produced from the stacked structure shown in FIG. 1.

To form a stacked structure 11 for producing an LED 10, a sapphire substrate 101 was placed in a quartz MOCVD reaction furnace around which an induction heating radio frequency (RF) coil was disposed. Nitrogen gas was allowed to flow therein for 10 minutes to purge the inside of the reaction furnace and then, the temperature of the substrate 101 was increased from the room temperature to 1150° C. for 10 minutes. While keeping the temperature of the substrate 101 at 1150° C., hydrogen gas and nitrogen gas were allowed to flow therein and the furnace was left as it was for 10 minutes to thermally clean the surface of the substrate 101.

As a first step, the sapphire substrate 101 was subjected to a surface treatment in which gas including vapor of trimethyl aluminum (TMAl) and vapor of trimethyl gallium (TMGa) which are mixed at molar ratio of 1:2, and ammonia ($NH_3$) were allowed to impinge on the substrate 101. Desired Group V/Group III ratio ($NH_3$/(TMAl+TMGa) concentration ratio) in the first step was set to about 85. The surface treatment was carried out at 1150° C. for six minutes and then, the supply of gas including vapor of TMGa and TMAl to reaction furnace was stopped.

Next, as a second step, an undoped n-type gallium nitride (GaN) layer 102 was formed on the (0001) sapphire substrate 101 for one hour, while flowing TMGa and ammonia gas, to a thickness of 0.8 µm.

An Si-doped n-type GaN layer 103 was formed on the undoped n-type GaN layer 102. When the layer 103 was formed, it was doped with silicon (Si) whose electron concentration was $5 \times 10^{18}$ cm$^{-3}$ using silane gas ($SiH_4$) as a doping source. The thickness of the Si-doped n-type GaN layer 103 was 2 µm.

Next, an Si-doped n-type aluminum gallium nitride ($Al_{0.09}Ga_{0.91}N$) layer 104 was formed on the Si-doped n-type GaN layer 103 using $SiH_4$ as a doping source and using TMGa, TMAl and $NH_3$ as raw materials. The carrier (hole) concentration of the $Al_{0.09}Ga_{0.91}N$ layer was $7 \times 10^7$ cm$^{-3}$, and the thickness was 8 nm.

The temperature of the substrate 101 was reduced from 1150° C. to 830° C. while supplying ammonia gas into the reaction furnace. Then, an n-type clad layer 105 of Si-doped indium gallium nitride ($In_{0.01}Ga_{0.99}N$) whose film thickness was 50 nm was formed on the $Al_{0.09}Ga_{0.91}N$ layer 104 while using trimethyl indium (TMIn) as indium raw material.

A light-emitting layer 2 of multiple quantum well structure constituted by barrier layers 21 of GaN and well layers 22 of $In_{0.04}Ga_{0.96}N$ was formed on the n-type clad layer 105. In forming the multiple quantum well structure, an Si-doped GaN barrier layer 21m was first formed on the n-type clad layer 105 of Si-dope $In_{0.01}Ga_{0.99}N$, and an $In_{0.04}Ga_{0.96}N$ well layer 22 was formed on the Si-doped GaN barrier layer 21m. The thickness of each well layer 22 was set to 2 nm. The Si-doped GaN barrier layers 21 and $In_{0.04}Ga_{0.96}N$ well layers 22 were stacked five times repeatedly and then, an Si-doped GaN barrier layer 21n was joined on the fifth $In_{0.04}Ga_{0.96}N$ well layer 22, and one end layer 21m of the multiple quantum well structure and the other end layer 21n on the side of a p-type clad layer 107 were formed as Si-doped GaN barrier layers 21.

The total number of the Si-doped GaN barrier layers 21 is six, and the thickness of each of the five Si-doped GaN barrier layers 21 except the other end layer 21n was set to 15 nm. The Si-doped GaN barrier layer forming the other end layer 21n was set to 20 nm in thickness which was larger than those of the other barrier layers.

The p-type clad layer 107 made of magnesium (Mg)-doped $Al_{0.07}Ga_{0.93}N$ was formed on the light-emitting layer 2 of the multiple quantum well structure. The concentration of the carrier (hole) of the p-type clad layer 107 was $5 \times 10^{17}$ cm$^{-3}$, and the film thickness thereof was 10 nm.

Further, an Mg-doped GaN layer was allowed to grow as a p-type contact layer 108 on the p-type clad layer 107. The concentration of the carrier (hole) of the p-type contact layer 108 was $8 \times 10^{17}$ cm$^{-3}$, and the film thickness thereof was 100 nm.

After the growth of the p-type contact layer 108 was completed, electric supply to the induction heater was stopped, and the temperature of the substrate 101 was lowered to room temperature over 26 minutes. When the temperature was lowered from the growing temperature (1100° C.) to 300° C., nitrogen was used as carrier gas in the reaction furnace, and 1% by volume of $NH_3$ was allowed to flow. Then, when the temperature of the substrate 101 reached 300° C., the flow of $NH_3$ was stopped, and atmospheric gas was only nitrogen. As soon as it was confirmed that the temperature of the substrate 101 was lowered to room temperature, the stacked structure 11 was taken out from the reaction furnace.

According to the above-described temperature reduction and cooling operation, p-type conductivity of the p-type contact layer 108 was obtained even if anneal processing for electrically activating Mg doped as the p-type impurities was not conducted.

The stacked structure 11 formed as described above was subjected to selective etching using the ordinary selective patterning technique, as the surface of the Si-doped GaN layer 103 was exposed only from a predetermined region where the n-type ohmic electrode 109 was to be formed. Then, an n-type ohmic electrode 109 in which four layers of Ni, aluminum (Al), titanium (Ti) and gold (Au) are sequentially stacked while the layer of nickel (Ni) comes into contact with the surface of the exposed Si-doped GaN layer 103 was provided on the Si dope GaN layer 103. As shown in FIG. 3, a transparent p-type ohmic electrode 110 of gold (Au) alone was formed on substantially the entire surface of the p-type contact layer 108 remaining on the surface of the stacked structure 11. A bonding pad (pedestal electrode) 111 in which titanium (Ti), aluminum (Al) and gold (Au) were sequentially stacked was bonded to the p-type ohmic electrode 110.

Then, the back surface of the sapphire substrate 101 having a thickness of 350 µm was polished to form a thin plate 100 µm in thickness, and it was further polished and finished to a flat mirror surface. Then, it was cut into square LED chips of 350 µm side as viewed from above. The LED chips 10 were joined to a lead frame so that device driving current could be allowed to flow through the LED chips 10 through the n-type ohmic electrode 109 and the p-type pedestal electrode 111.

The forward device driving current was allowed to flow between the n-type ohmic electrode 109 and the p-type ohmic electrode 110 to allow the LED chip 10 to emit light. The light emitting wavelength when the forward current was set to 20 mA was 395 nm. The light emitting output measured using a general integrating sphere was as high as 8.7 mW. With this, it was indicated that a near-ultraviolet LED of high light emitting output could be obtained.

COMPARATIVE EXAMPLE

In Comparative Example, LEDs were formed using a light-emitting layer of multiple quantum well structure having barrier layers of the same thickness. The light emitting characteristics were compared.

That is, in the multiple quantum well structure described in Example 1, the other end layer (21n in FIG. 2) was made of an Si-doped GaN barrier layer having the same thickness as the other barrier layers. Other than the light-emitting layer of the multiple quantum well structure, factors were the same as the stacked structures and electrode structures described in Example 1.

Forward current of 20 mA was allowed to flow through the LED chips mounted in the same manner as in Example 1 via the lead frame, and light in a near-ultraviolet region having wavelength of 395 nm was emitted. Although the light emitting wavelength of the LED chips was the same as that of the LED chips 10 of Example 1, the forward current was as high as 3.5 V. However, the light emitting output was reduced to 5.9 mW and did not reach the characteristics of the LED 10 of Example 1.

EXAMPLE 2

In Example 2, the contents of the present invention will be explained concretely based on a case in which a Group III nitride LED is formed using the light-emitting layer of multiple quantum well structure having barrier layers. The thicknesses of the barrier layers are different from one another.

In Example 2, in forming the multiple quantum well structure constituting the light-emitting layer described in Example 1, the thickness of the barrier layer of the one end layer (21m in FIG. 2) was set to 15 nm, that of the second barrier layer was set to 16 nm, that of the third barrier layer was set to 17 nm, thickness of the fourth barrier layer was set to 18 nm, and that of the fifth barrier layer was set to 19 nm.

That is, the multiple quantum well structure was formed, with the thicknesses of the Si dope GaN barrier layers reduced from the n-type clad layer (105 in FIGS. 1 and 2) toward the p-type clad layer (107 in FIGS. 1 and 2). The thickness of the Si dope GaN barrier layer forming the other end layer 21n was set to 20 nm.

Forward device driving current of 20 mA was allowed to flow through the LED chips that were formed in the same manner as in Example 1, and characteristics were evaluated. The light emitting wavelength was 395 nm. Although the forward voltage was as high as 3.3 V, the light emitting output is as high as 8.9 mW as Example 1, and high output and near-ultraviolet region LEDs were obtained. If the LED is compared with the conventional LED described in Comparative Example, the forward voltage and light emitting output of Example 2 were more excellent.

EXAMPLE 3

The present invention will be described concretely based on a case in which a Group III nitride semiconductor layer is formed using a light-emitting layer of multiple quantum well structure utilizing as the other end layer a barrier layer in which impurities were distributed.

In Example 3, the other end layer 21n forming the multiple quantum well structure described in Example 1 was made of an Si-doped GaN layer in which the concentration of Si impurities was set to be low on the side of the junction region with respect to the well layer, was higher at the central portion of the layer, and was gradually reduced from the central portion in the thickness-increasing direction (toward the p-type clad layer 107).

In the other end layer, the concentration of Si impurities from the junction region with respect to the well layer to an internal region of 5 nm in the thickness-increasing direction was set to $3\times10^{17}$ cm$^{-3}$. The concentration of Si impurities in a central region of the barrier layer which exceeds from the junction region with respect to the well layer in the thickness direction by 5 nm to 10 nm was set to $4\times10^{18}$ cm$^{-3}$. In a region from the central region toward the junction region with respect to the p-type clad layer, the concentration of the Si impurities was linearly reduced from $4\times10^{18}$ cm$^{-3}$ to $7\times10^{17}$ cm$^{-3}$. The concentration of the Si impurities in each region was adjusted by varying the flow rate of SiH$_4$ gas to be supplied to the reaction system with elapse of time when the barrier layer forming the other end layer was formed.

LED chips were formed in the same manner as in Example 1, and forward current was allowed to flow through the chips. The light emitting wavelength when the forward current was set to 20 mA was 395 nm. The forward voltage was as low as 3.2V, the light emitting output was 8.6 mW, and if it is compared with the conventional LED described in Comparative Example, the forward voltage and light emitting output of the LED of Example 3 were excellent.

INDUSTRIAL APPLICABILITY

The Group III nitride semiconductor light-emitting device according to the present invention has its well structure enhanced in crystallinity, resulting in enhancing the emission output and electro-optical conversion efficiency to a great extent to contribute to energy saving.

The invention claimed is:

1. A pn junction type Group III nitride semiconductor light-emitting device comprising a light-emitting layer of multiple quantum well structure in which well layers and barrier layers including Group III nitride semiconductors are alternately stacked periodically between an n-type clad layer and a p-type clad layer which are formed on a crystal substrate and which include Group III nitride semiconductors,
   wherein a first end layer of the light-emitting layer is in contact with the n-type clad layer, and a second end layer of the light-emitting layer is in contact with the p-type clad layer, both the first and second end layers are barrier layers, and the second end layer is thicker than the barrier layer of the first end layer,
   wherein the barrier layers other than the second end layer have a thickness of 15 nm or more and 50 nm or less, and the second end layer has a thickness of 1.2 or more times and 2.5 or less times the thickness of the barrier layers other than the second end layer, and
   wherein the barrier layer of the second end layer includes n-type impurities.

2. The pn junction type Group III nitride semiconductor light-emitting device according to claim 1, wherein each of the barrier layers has a thickness increased gradually from the first end layer toward the second end layer.

3. The pn junction type Group III nitride semiconductor light-emitting device according to claim 1, wherein the second end layer has an impurity concentration low at its junction portion relative to the well layer, highest at its central portion and reduced gradually from the central portion toward the p-type clad layer.

4. The pn junction type Group III nitride semiconductor light-emitting device according to claim 1, wherein the second end layer has joined thereto a well layer which, is not intentionally doped with impurities.

\* \* \* \* \*